United States Patent [19]

Delage et al.

[11] Patent Number: 5,194,403
[45] Date of Patent: Mar. 16, 1993

[54] METHOD FOR THE MAKING OF THE ELECTRODE METALLIZATIONS OF A TRANSISTOR

[75] Inventors: Sylvain Delage, Paris; Philippe Collot, Orsay; Marie-Antoinette Poisson, Paris, all of France

[73] Assignee: Thomson-CSF, Puteaux, France

[21] Appl. No.: 769,837

[22] Filed: Oct. 2, 1991

[30] Foreign Application Priority Data

Oct. 9, 1990 [FR] France ................. 90 12442

[51] Int. Cl.$^5$ ............... H01L 21/285; H01L 21/308
[52] U.S. Cl. ........................... 437/184; 437/225; 437/228
[58] Field of Search ............ 437/184, 225, 228; 357/16

[56] References Cited

U.S. PATENT DOCUMENTS

| | | | |
|---|---|---|---|
| 3,801,391 | 4/1974 | Dyment et al. | 357/16 |
| 4,049,488 | 9/1977 | Tijburg | 357/16 |
| 4,829,347 | 5/1989 | Cheng et al. | 357/16 |
| 4,889,831 | 12/1989 | Ishii et al. | 437/184 |
| 4,954,457 | 9/1990 | Jambotkar | 437/184 |
| 5,097,312 | 3/1992 | Bayraktaroglu | 357/16 |

FOREIGN PATENT DOCUMENTS

| | | | |
|---|---|---|---|
| 0367698 | 5/1990 | European Pat. Off. | |
| 63-1066 | 1/1988 | Japan | 437/225 |
| 1-233767 | 9/1989 | Japan | 357/16 |
| 1-241867 | 9/1989 | Japan | 357/16 |

OTHER PUBLICATIONS

Umebachi et al., "A New Heterojunction Gate GaAs FET", IEEE Transactions on Electron Devices, Aug. 1975, pp. 613-614.

1987 IEEE MTT-S International Microwave Symposium Digest, vol. 2, Jun. 9-11, 1987, pp. 969-972, B. Bayraktaroglu, et al. "AlGaAs/GaAs Heterojunction Bipolar Transistors With 4W/mm Power Density At X-Band".

*Primary Examiner*—Olik Chaudhuri
*Assistant Examiner*—Ourmazd S. Ojan
*Attorney, Agent, or Firm*—Oblon, Spivak, McClelland, Maier & Neustadt

[57] ABSTRACT

The aim of the method is to prevent parasitic metallizations on the lateral walls of a raised pattern, which is used to self-align the electrode metallizations in a transistor. To this effect, a pair of semiconductor materials is introduced into the vertical pattern. These semiconductor materials react differently with respect to a pair of etching methods, so that a layer of one semiconductor material is etched to a greater extent than the other layer. The overhanging feature thus created interrupts the parasitic metallizations, if any, between the electrodes. The disclosed method can be applied to vertical structures.

3 Claims, 1 Drawing Sheet

METHOD FOR THE MAKING OF THE ELECTRODE METALLIZATIONS OF A TRANSISTOR

BACKGROUND OF THE INVENTION

1. Field of the Invention

The present invention relates to a method for the making of the metallizations of a transistor, the insulation of which is obtained by the making, on the vertical walls, of a pattern used to self-align these metallizations. This method can be applied to the vertical components using a metallization manufactured by the self-alignment technique. It enables eliminating the risks of short-circuits on the flanks of the vertical pattern.

2. Description of the Prior Art

The term "vertical components" is generally applied to those in which the current is conveyed perpendicularly to the surface of the substrate. These components comprise a stack of layers of semiconductor materials, at least one layer of which is etched in the form of a mesa, i.e. it forms a raised pattern that generally bears an electrode metallization. Thus, heterojunction bipolar transistors (or HPTs) are vertical components: the emitter, the base and the collector are on three different levels. There are certain transistors, for example SIS-FETs (semiconductor-insulation-semiconductor FETs), in which the current flows parallel to the surface of the substrate but which nonetheless can be considered to be vertical components from the viewpoint of the invention, inasmuch as they have an etched mesa pattern used to self-align two types of metallizations.

These vertical components have so-called "double mesa" structures for which the technology dictates at least two etchings used to uncover the base and demarcate the collectors, if the transistor referred to is a bipolar transistor, or else the gate and the source/drain if the transistor referred to is a field-effect transistor. To simplify the explanation of the invention, it shall be presented with reference to the example of a bipolar transistor.

One of the limitations of this type of component arises out of the access resistances of the base as well as the base-collector capacitances in the case of an HBT. The most efficient approach to reducing these parasitic phenomena lies in carrying out the self-alignment of the base with respect to the emitter.

The difficulty of self-alignment methods arises out of the risks of the short-circuiting of the emitter-base metal contacts. For, it is commonly the mesa of the emitter that will act as a self-alignment mask for the base metallization: when the metal is evaporated, there is a real risk that traces of metal on the flanks of the mesa might lead to an emitter-base short-circuit. Various techniques are commonly used to prevent these short circuits. These are:

either a side-wall type deposition of an insulator on the flanks of the emitter, followed by an anisotropic evaporation of the base metallization. The metal traces on the flanks of the mesa are then eliminated by ion bombardment. The method is a delicate one by its very essence, and depends a great deal on the evaporation systems used.

or the etching of the semiconductor layer of the emitter in a T shape. This enables the creation of a helmet that creates a shadow phenomenon during the evaporation of the base metal and thus prevents the problems of short-circuits. The limitations of this technique arise out of the uncertainties of etching of the foot of the emitter. The geometry of the emitter is not controlled with precision, or again the metallization of the emitter is mushroom-shaped. The semiconductor material is then chemically etched from the foot of the metallization onwards. A helmet enabling self-alignment is thus created. The major drawback of this technique arises out of the fact of resorting to chemical etching processes which sometimes raise problems and lack precision and reliability.

SUMMARY OF THE INVENTION

The self-alignment method according to the invention is not at all difficult to implement. It can be applied to components using the III-V or Si-SiGe pairs of materials. It makes it necessary to have a pair of materials and a pair of etching methods such that there is reciprocal selectivity: the method used for etching the first material does not etch the second material and vice versa. In other words, the invention relies on the use of existing etching selectivities for numerous pairs of semiconductor materials, applied to a vertical structure in which there is inserted a layer that is easily etched as compared with the other layers.

More precisely, the invention concerns a method for the making of the electrode metallizations of a transistor, self-aligned by a raised pattern, wherein a pair of semiconductor materials is introduced into the raised pattern, said pair of semiconductor materials reacting in different ways with respect to a pair of etching methods, so that a first semiconductor layer, located between a first metallization and a second semiconductor layer, is etched to a greater extent, the overhanging feature thus formed participating in the insulation between the first metallization located on the raised pattern and at least one second metallization located at the foot of the pattern.

BRIEF DESCRIPTION OF THE DRAWING

The invention will be understood more clearly from the following description of an exemplary embodiment, made in conjunction with the appended FIGS. 1 to 6, which represent different steps in the method for the making of the self-aligned metallizations.

DETAILED DESCRIPTION OF THE INVENTION

In order to make the explanations clearer, the GaAs/GaInP pair has been chosen because of its excellent performance characteristics. This in no way restricts the scope of the invention: if the materials change, the selective etching methods change too.

Figure 1:
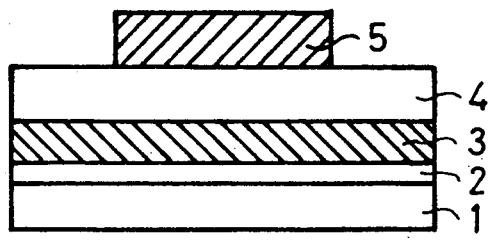

FIG. 1 shows a simplified sectional view of wafer of semiconductor materials epitaxially grown on a substrate, comprising for example:

a N type GaAs layer 1 that will constitute the collector of the HBT transistor, one underlayer of which, on the free face, is given N+ doping and will be used as a collector contact;

a layer 2 made of P+ GaAs which will act as the base of the transistor;

A layer 3 made of N type GaInP which will constitute the emitter of the HBT. It has an etching selectivity with respect to GaAs;

A layer 4 of N+ GaAs for the ohmic contact, offering excellent etching selectivity with respect to GaInP.

More generally, the method according to the invention can be applied to any vertical structure constituted by layers of materials having substantial degrees of selectivity with respect to etching by dry methods such as reactive ion etching (RIE). The basis of the invention consists of the insertion, into the vertical structure, of a pair of materials. One of these materials, inserted in depth, acts as a barrier layer while the other one, on the surface, is etched easily, thus enabling the creation of an overhanging feature beneath a mask.

Since the aim of this method is the self-alignment of the metallizations, the mask in question is constituted by the emitter metallization 5, made of AuGe/Ni/Au which, in alloy, form an excellent ohmic contact on N+ GaAs.

Figure 2:
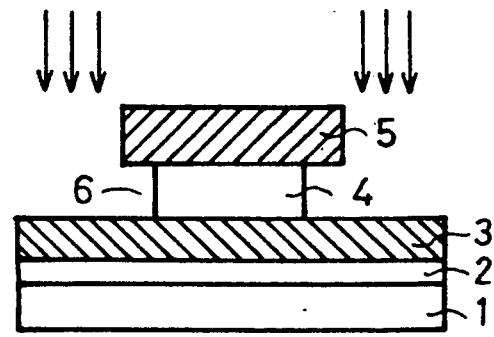

The second step, shown in FIG. 2, is a reactive ion etching symbolized by arrows: this first ion etching cleans the surface layer 4 of semiconductor material but stops upon contact with the barrier layer 3, owing to the etching selectivity. However, in extending the etching, the layer 4 is sub-etched at 6 beneath the mask 5.

For the pair of materials GaAs/GaInP, the ion etching of GaAs by $CCl_2F_2$ in the presence of oxygen enables an almost infinite selectivity with respect to GaInP and a sub-etching 6 with a depth of 200 nm in about one minute.

Figure 3:
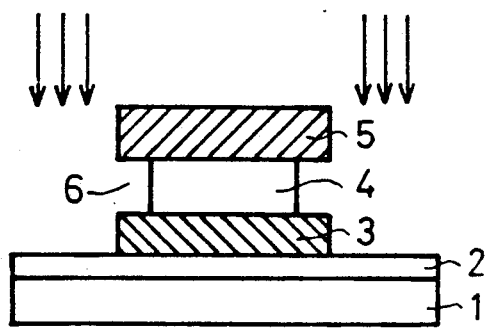
Figure 4:
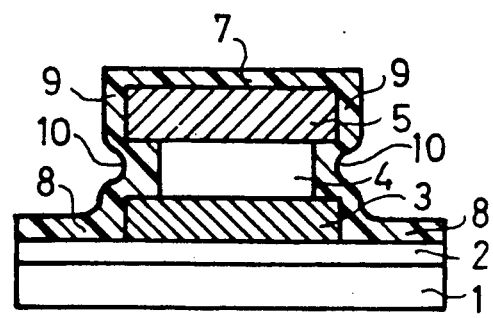

During the third step, in FIG. 3, the layer 3 of GaInP is etched by a second reactive ion etching, by means of $CH_4$ and helium or hydrogen. Since RIE etching is basically anisotropic, the layer 3 of GaInP is self-aligned on the metal mask 5 The surface of the emitter is exactly that of the mask 5. Besides, in using $CH_4$ and He or $H_2$, the etching selectivity is of the order of four between GaInP and GaAs, which means that GaInP is etched four times faster than GaAs, thus enabling a efficient control of the stopping of the etching upon contact with the layer 2 of the base.

A known method, such as sputtering or chemical deposition, is used to cover the entire structure with an insulator layer such as $Si_3N_4$ which is preferable to $SiO_2$ with III-V compounds such as GaAs;

The chosen method is isotropic, so that the deposition is done equally on all the surfaces: at 7 on the emitter metallization 5, at 8 on the rim of the emitter layer 3 and at 9 on the flanks of the mesa. The presence of a sub-etching 6 in the layer 4 of GaAs results at 10 in a recess in the layer 9 of insulator.

It is this recess 10 that will, subsequently, after the deposition of the self-aligned metallizations, prevent short-circuits between the emitter metallization and the base metallizations, because the metal will not be deposited at the bottom of the recess 10.

Figure 5:
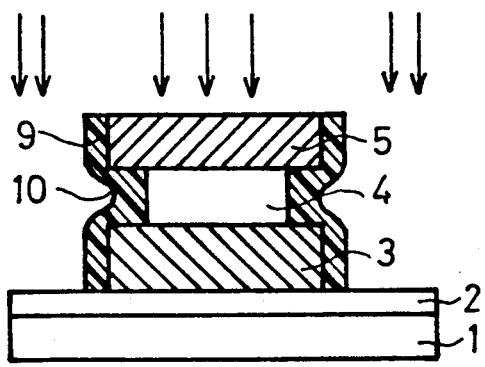

The fifth step of the method according to the invention therefore consists in eliminating the parts of this insulating layer that will be replaced by metallizations. It can be seen in FIG. 5 that the layer 7, deposited on the metallization 5, and the layer 8, deposited on the base layer 2, around the emitter 3 made of GaInP, are eliminated: they have been eliminated by a third reactive ion etching by means of $SF_6$. This etching is anisotropic and leaves the flanks of the raised pattern covered with insulator at 9.

Figure 6:
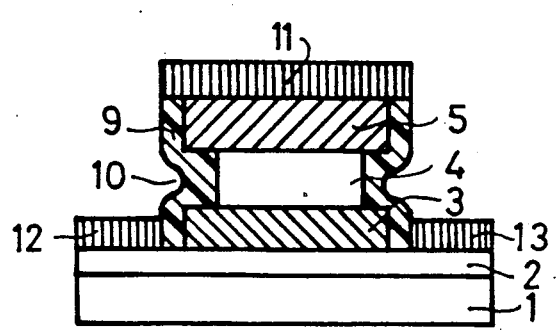

Finally, as shown in FIG. 6, the base contact is deposited by vapor deposition of metal, Ti/Pt/Au for example. The layer 11 is deposited on the metal contact 5 of the emitter. The layers 12+13 get deposited on the base layer 2 and get self-aligned with respect to the layers 5, 4, 3. The distance from 12 and 13 to the foot of the mesa 3 may be as short as 50 mm.

During this metallization operation, it is usual for the metal particles to get deposited on the flanks of the mesa, i.e. on the insulator layer 9. However, the vapor deposition method used is substantially directional, and the metal does not get deposited at the bottom of the recess 10. Thus, even if metal particles are deposited on the insulator layer 9, there is a break at the recess or groove 10, thus preventing leakages or short-circuits between the emitter and the base.

The invention has been explained with reference to the example of an HBT type vertical transistor, but those skilled in the art will easily see that it can be applied to any device comprising at least one mesa layer (3) on which it is possible, without any difficulty, to add a layer (4) that can be easily etched, the purpose of this being to self-align the metallizations. Thus, those skilled in the art will will easily identify a field-effect transistor in FIG. 6, the source, gate and drain electrodes of which are respectively the metallizations 12, 11 and 13, and the active layer or channel of which is at 2.

The following are the advantages of the method according to the invention, as specified for the exemplary application:

the etching of a controlled recess by R.I.E. type etchings, namely reproducible etchings;

the automatic passivation of the flanks of the emitter;

a known geometry of the foot of the emitter;

the absence of a step of the ion bombardment type, which is very likely to jeopardize the performance characteristics of the devices;

the limitation of the surface currents at the base-emitter junction. The foot of the emitter and the spacing between it and the base ohmic contact are passivated.

It is clear that the invention can be applied to III-V and II-VI materials as well as to silicon, silicon-germanium, silicon carbide or diamond materials. It is limited solely by the need to have two semiconductor materials and two etching methods such that the etching of a first material is selective with respect to the second material and vice versa.

What is claimed is:

1. A method for the making of the electrode metallizations of a transistor, self-aligned by a raised pattern, wherein said raised pattern is comprised of first and second semiconductor materials, said first and second semiconductor materials reacting in different ways with respect to a pair of etching methods, so that a first semiconductor layer, composed of said first semiconductor material, located between a first metallization and a second semiconductor layer, composed of said second semiconductor material, is etched to a greater extent than said second semiconductor layer, the overhanging feature thus formed participating in the insulation between the first metallization located on the raised pattern and at least one second metallization located at the foot of the pattern.

2. A method according to claim 1, comprising the following steps:

from a semiconductor body already comprising the layers of a first semiconductor material and a second semiconductor material, deposition of a metal mask at the location of a future first transistor electrode, by a first reactive ion etching (RIE) with chlorinated compounds in the presence of helium, etching of the first layer made of a first semiconductor material, with sub-etching beneath the metal mask, by a second reactive ion etching with methane in the presence of hydrogen, etching of the second layer made of a second semiconductor material, self-aligned by the metal mask, by a non-directional method, deposition of an insulator layer on the raised pattern formed by first and second semiconductor layers and by the metal mask, the sub-etching beneath the mask causing a recess in the lateral insulator wall, by a third reactive ion etching of sulphur hexafluoride, removal of the insulator layers deposited on the metal mask and on the foot of the raised pattern;

by a directional method, deposition of the first and second metallizations, self-aligned by the pattern and insulated with respect to each other by the overhanging feature formed in the lateral insulator walls.

3. A method according to claim 1, wherein the first semiconductor material is GaAs and the second semiconductor material is GaInP.

* * * * *